United States Patent
Park et al.

(10) Patent No.: US 8,102,214 B2
(45) Date of Patent: Jan. 24, 2012

(54) CONTROLLED-GAIN WIDEBAND FEEDBACK LOW NOISE AMPLIFIER

(75) Inventors: Bong-Hyuk Park, Daejeon (KR); Kwang-Chun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/868,468

(22) Filed: Aug. 25, 2010

(65) Prior Publication Data

US 2011/0063035 A1 Mar. 17, 2011

(30) Foreign Application Priority Data

Sep. 14, 2009 (KR) .................. 10-2009-0086437

(51) Int. Cl.
*H03F 1/34* (2006.01)
(52) U.S. Cl. .................. 330/291; 330/98; 330/311
(58) Field of Classification Search .......... 330/310–311, 330/98, 133, 150
See application file for complete search history.

(56) References Cited

U.S. PATENT DOCUMENTS

| 3,449,686 | A  | * | 6/1969 | Bladen ........................ 330/277 |
| 6,288,609 | B1 |   | 9/2001 | Brueske et al. |
| 6,778,017 | B2 | * | 8/2004 | Analui et al. ................. 330/292 |
| 2008/0048785 | A1 | | 2/2008 | Mokhtar et al. |

* cited by examiner

*Primary Examiner* — Hieu Nguyen
(74) *Attorney, Agent, or Firm* — Rabin & Berdo, P.C.

(57) ABSTRACT

Provided is controlled-gain wideband feedback low-noise amplifier. The controlled-gain wideband feedback low-noise amplifier includes: a feedback amplifier configured to isolate an input signal and an output signal obtained by amplifying the input signal, feed back the output signal to the input signal to amplify wideband input signals, resonate a low-frequency band signal among the wideband input signals to amplify the low-frequency band signal among the wideband input signals, and be switched in accordance with a control signal to control an amplification gain of the low-frequency band signal among the wideband input signals; and a cascode amplifier configured to amplify a high-frequency band signal among the wideband signals inputted from the feedback amplifier, and be switched in accordance with a control signal to control an amplification gain of the high-frequency band signal among the wideband signals.

18 Claims, 9 Drawing Sheets

CONTROLLED-GAIN WIDEBAND FEEDBACK LOW NOISE AMPLIFIER

CROSS-REFERENCE TO RELATED APPLICATIONS

The present application claims priority of Korean Patent Application No. 10-2009-0086437, filed on Sep. 14, 2009, which is incorporated herein by reference in its entirety.

BACKGROUND OF THE INVENTION

1. Field of the Invention

Exemplary embodiments of the present invention relate to a low noise amplifier which is used in a receiver stage of a fourth-generation mobile communication terminal system; and, more particularly, to a controlled-gain wideband feedback low noise amplifier which operates in a high-gain mode, a mid-gain mode, or a low-gain mode, depending on a control voltage.

2. Description of Related Art

In general, a signal received by a radio frequency (RF) receiver stage has a very low power level due to the influence of attenuation and noise. Therefore, it is necessary to amplify the power of the received signal. Since the received signal contains much noise while being transmitted through a wireless communication channel, an amplification function for minimizing the noise is required.

The RF receiver stage is a first-stage system of a receiver, which may affect the performance of the receiver. The RF receiver stage typically includes a low-noise amplification unit, a mixer, and a local oscillator. To configure a high-performance receiver system, a noise factor (NF) and amplification gain of the low-noise amplification unit, a conversion loss and harmonic distortion of the mixer, and the frequency stability of the local oscillator should be considered. However, the NF and amplification gain of the low-noise amplification unit may have the largest effect upon the performance of the system.

A low-noise amplifier (LNA) is a high-frequency amplifier (LNA) configured to reduce the NF of the entire receiver including the low-noise amplification unit. The LNA is used for a communication line with a large propagation loss or the transmission and reception of signals with a low input voltage, and serves to amplify a weak signal received by an antenna in the communication system.

To obtain a low-noise characteristic, a small amount of current should be used while a small number of thermal noise elements such as transistors and resistors having a low NF are used. Furthermore, a maximum gain needs to be secured through matching.

FIG. 1 is a circuit diagram of a conventional LNA. Referring to FIG. 1, the conventional LNA will be described as follows. The conventional LNA has a cascode structure in which a common-source transistor Q1 and a common-gate transistor Q2 are connected in series to each other.

In the conventional LNA illustrated in FIG. 1, a resistor R5 and a capacitor C5 are connected in series to each other such that the output of the common-source transistor Q1 stably operates. Furthermore, the output of the common-gate transistor Q2 is connected to an input terminal through a feedback structure of a shunt-feedback scheme so as to control a gain of the LNA without changing input impedance of the common-source transistor Q1.

However, the conventional LNA is not provided with a controlled-gain function. Therefore, to support the controlled-gain function, a controlled-gain amplifier should be used together with the conventional LNA. Accordingly, the conventional LAN with a controlled-gain amplifier is not suitable for being used in a receiver stage of the fourth-generation mobile communication terminal system of which the utilization space and power consumption should be minimized mechanically and functionally.

SUMMARY OF THE INVENTION

An embodiment of the present invention is directed to a controlled-gain wideband feedback LNA which is used in a receiver stage of a fourth-generation mobile communication terminal system.

Another embodiment of the present invention is directed to a controlled-gain wideband feedback LNA in which input matching is implemented at a wideband and which increases the entire low-noise amplification gain.

Another embodiment of the present invention is directed to a controlled-gain wideband feedback LNA which control switches in accordance with control voltages so as to operate in a high-gain mode, a mid-gain mode, and a low-gain mode, respectively.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a controlled-gain wideband feedback LNA includes: a feedback amplifier configured to isolate an input signal and an output signal obtained by amplifying the input signal, feed back the output signal to the input signal to amplify wideband input signals, resonate a low-frequency band signal among the wideband input signals to amplify the low-frequency band signal among the wideband input signals, and be switched in accordance with a control signal to control an amplification gain of the low-frequency band signal among the wideband input signals; and a cascode amplifier configured to amplify a high-frequency band signal among the wideband signals inputted from the feedback amplifier, and be switched in accordance with a control signal to control an amplification gain of the high-frequency band signal among the wideband signals.

In accordance with another embodiment of the present invention, a controlled-gain wideband feedback LNA includes: a feedback amplifier including: a first cascode amplifier stage including a first common-source NMOS transistor and a first common-gate NMOS transistor which are connected in series to each other; a feedback circuit configured to feed back output signals of the first common-gate NMOS transistor to the first common-source NMOS transistor; a first load stage configured to resonate a low-frequency band signal of the output signals; and first and second switches configured to switch the feedback circuit and the cascode amplifier stage, respectively, in accordance with control signals; and a cascode amplifier including: a second cascode amplifier stage including a second common-source NMOS transistor and a second common-gate NMOS transistor which are connected in series to each other; a second load stage configured to resonate a high-frequency band signal of output signals of the second common-gate NMOS transistor; and a third switch configured to switch the second cascode amplifier stage in accordance with a control signal. The feedback amplifier amplifies a low-frequency band signal among wideband signals which are inputted in accordance with the operations of the first and second switches, the cascode amplifier amplifies a high-frequency band signal among wideband signals which are inputted from the feedback amplifier in accordance with the operation of the third switch, and the gain of the entire circuit is controlled by operating the first to third switches in accordance with the control signals.

The controlled-gain wideband feedback LNA may further include an output buffer configured to output the signals inputted from the cascode amplifier to an output terminal without attenuation. The output buffer may be implemented as a source follower.

The feedback amplifier, the cascode amplifier, and the source follower may include AC coupling capacitors provided at input and output terminals thereof.

The control signals may include a first voltage and a second voltage higher than the first voltage. The first voltage may be applied to the first to third switches such that the controlled-gain wideband feedback LNA has a high-gain characteristic. The second voltage may be applied to the first to third switches such that the controlled-gain wideband feedback LNA has a low-gain characteristic. The first voltage and the second voltage may be applied to the first switch and the second and third switches, respectively, such that the controlled-gain wideband feedback LNA has a mid-gain characteristic.

The feedback circuit of the feedback amplifier may include a capacitor connected to the drain of the first common-gate NMOS transistor and a feedback resistor connected to the gate of the first common-source NMOS transistor, and the capacitor and the feedback resistor are connected in series to each other.

The first switch may be implemented as an NMOS switch connected in parallel to the feedback resistor. The second switch may be implemented as an NMOS switch connected in parallel to the source of the first common-gate NMOS transistor and the first load stage. The third switch may be an NMOS switch connected in parallel the source of the second common-gate NMOS transistor and the second load stage.

The first load stage of the feedback amplifier may be implemented as an inductor which is connected to the drain of the first common-gate NMOS transistor and resonates a low-frequency band signal of the output signals to apply the low-frequency band signal to the cascode amplifier. The second load stage of the cascode amplifier may be implemented as an inductor which is connected to the drain of the second common-gate NMOS transistor and resonates a high-frequency band signal of the output signals to apply the high-frequency band signal to the source follower.

The feedback amplifier may further include an inductor for input matching, which is provided at the gate and source of the first common-source NMOS transistor, respectively. The feedback amplifier may further include a high-capacity capacitor which is provided between the gate and source of the first common-source NMOS transistor so as to input a signal inputted to the gate of the first common-source NMOS transistor.

DESCRIPTION OF SPECIFIC EMBODIMENTS

Figure 1:
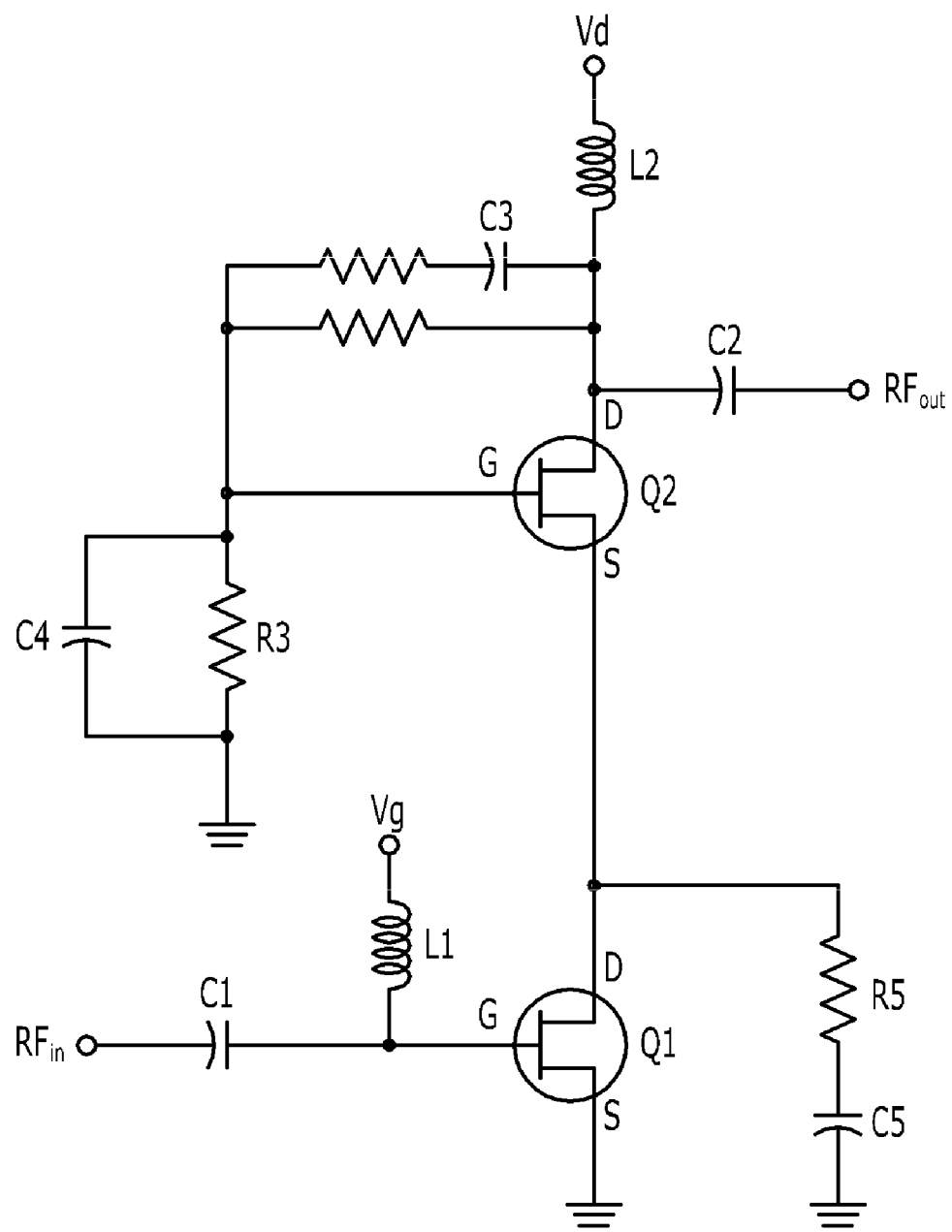
FIG. 1 is a circuit diagram of a conventional LNA.

Exemplary embodiments of the present invention will be described below in more detail with reference to the accompanying drawings. The present invention may, however, be embodied in different forms and should not be constructed as limited to the embodiments set forth herein.

Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. The drawings are not necessarily to scale and in some instances, proportions may have been exaggerated in order to clearly illustrate features of the embodiments.

Hereafter, the configuration and operation of a controlled-gain wideband feedback LNA in accordance with an embodiment of the present invention will be described in detail with reference to FIGS. 2 and 3. FIGS. 4 to 9 show power gain characteristics and NF characteristics in a high-gain mode, a mid-gain mode, and a low-gain mode which are controlled-gain modes of the controlled-gain wideband feedback LNA in accordance with the embodiment of the present invention. Referring to FIGS. 4 to 9, it is possible to check effects obtained by applying the controlled-gain wideband feedback LNA in accordance with the embodiment of the present invention.

Figure 2:
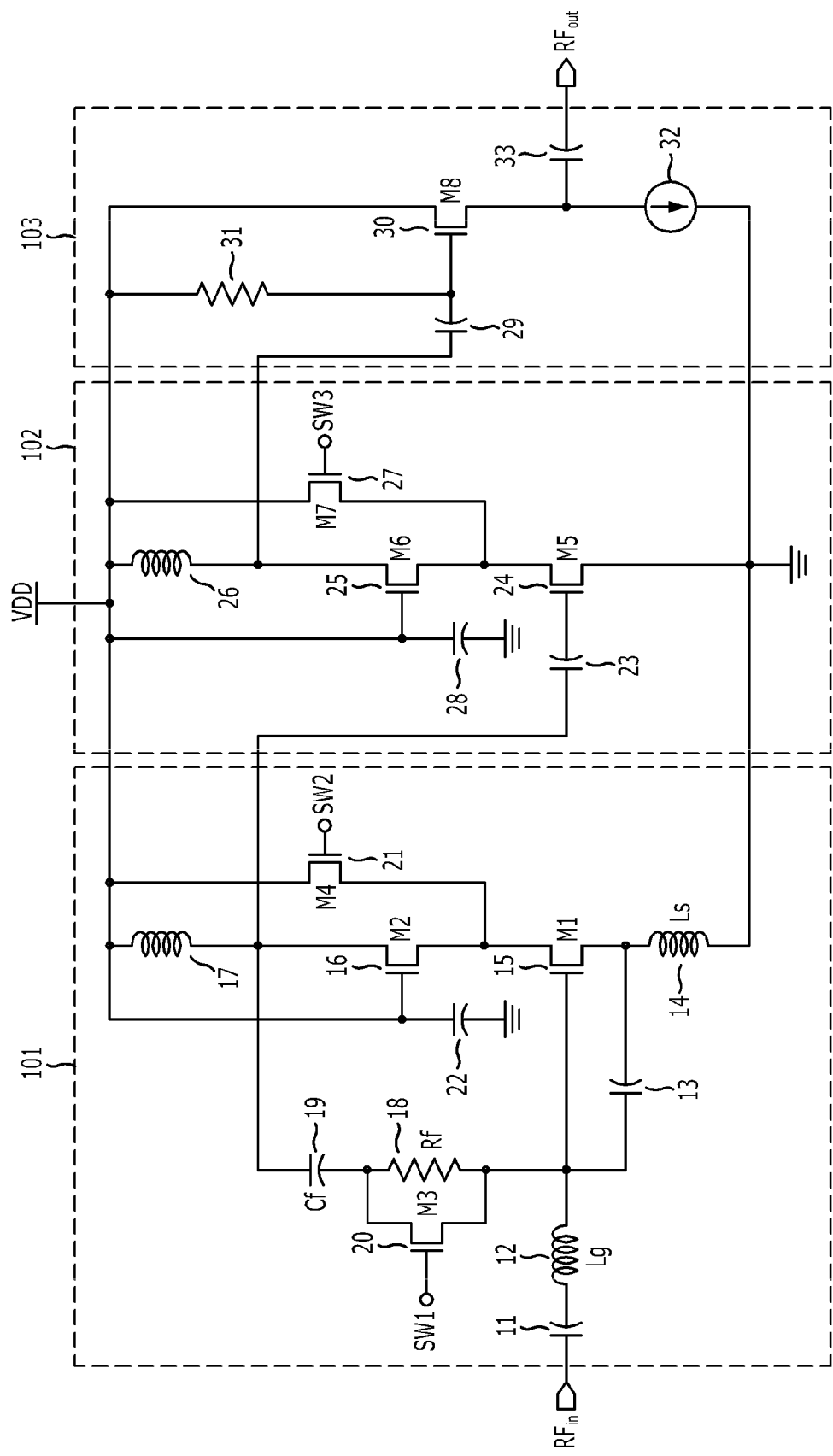
FIG. 2 is a circuit diagram of a controlled-gain wideband feedback LNA in accordance with an embodiment of the present invention.

FIG. 2 is a circuit diagram of the controlled-gain wideband feedback LNA in accordance with the embodiment of the present invention. Referring to FIG. 2, the controlled-gain wideband feedback LNA includes a feedback amplifier 101, a cascode amplifier 102, and a source follower 103.

The feedback amplifier 101 includes a common-source NMOS transistor 15 and a common-gate NMOS transistor 16 which are connected in series to configure a cascode amplification stage. Signals outputted from the drain of the common-gate NMOS transistor 16 are applied to a common-source NMOS transistor 24 through an AC coupling capacitor 23, and some of the signals are fed back to the common-source NMOS transistor 15 through a feedback circuit configured as a serial connection circuit of a capacitor 19 and a resistor 18. A low-frequency band signal of the signals outputted from the drain of the common-gate NMOS transistor 16 is resonated in an inductor 17.

A switch SW1 connected in parallel to the resistor of the feedback circuit is configured as an NMOS transistor 20, and serves to switch the feedback circuit in accordance with a control signal applied to the gate thereof. A switch SW2 connected in parallel to the source of the common-gate NMOS transistor 16 of the cascode amplification stage and the inductor 17 is configured as an NMOS transistor 21 and serves to switch the cascode amplification stage in accordance with a control signal applied to the gate thereof.

In the controlled-gain wideband feedback LNA in accordance with the embodiment of the present invention, signals inputted through an input terminal $RF_{in}$ of the feedback amplifier 101 are transferred to the gate of the common-source NMOS transistor 15 and a capacitor 13 through an AC coupling capacitor 11 and an inductor 12 for input matching. The capacitor 13 serves to increase the input capacitance of the common-source NMOS transistor 15 such that the input matching may be easily performed without increasing the size of the common-source NMOS transistor 15.

The signals applied to the common-source NMOS transistor 15 is transferred to the inductor 17 through the common-gate NMOS transistor 16. Some of the signals transferred to the inductor 17 are inputted to the gate of the common-source NMOS transistor 15 through the serial circuit of the capacitor 19 and the resistor 18, which is the feedback circuit designed to have a wideband characteristic.

Figure 3:
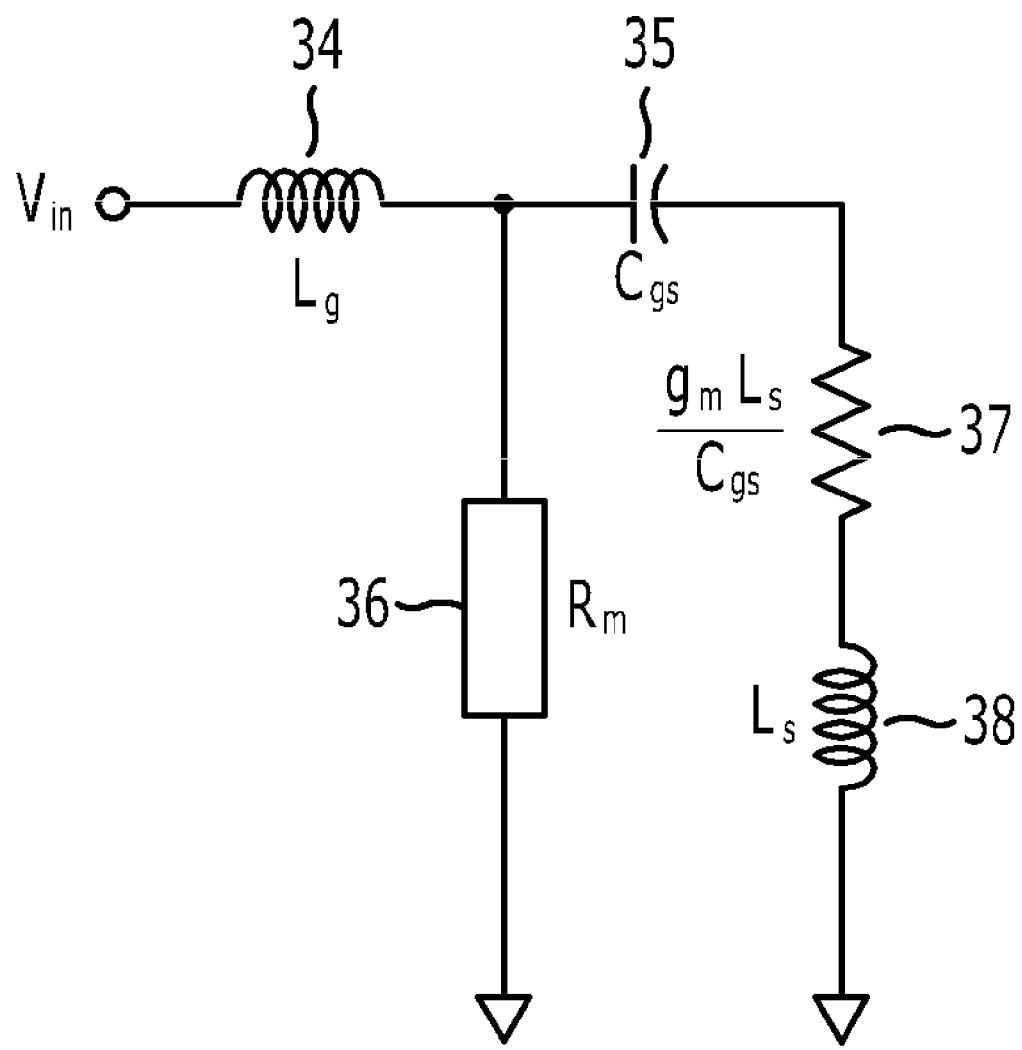
FIG. 3 illustrates an equivalent circuit of a feedback amplifier of the controlled-gain wideband feedback LNA of FIG. 2.

The wideband characteristic of the feedback amplifier 101 configured in the above-described manner may be described as follows, with reference to FIG. 3 illustrating the feedback amplifier of the controlled-gain wideband feedback LNA of FIG. 2 as an equivalent circuit.

First, a Miller equivalent resistance Rm of a resistor 36 of FIG. 3 may be expressed as Equation 1 below.

$$R_m = \frac{R_f}{1 - A_v} \quad \text{Eq. 1}$$

where $R_f$ represents a feedback resistor, and $A_v$ represents an amplifier gain.

A quality factor of FIG. 3 may be expressed as Equation 2 below.

$$Q \approx \frac{1}{\left[\frac{g_m}{C_{gs}} L_s + (\omega_0 L_g)^2 / R_m\right] \cdot \omega_0 \cdot C_{gs}} \quad \text{Eq. 2}$$

where $G_m$ represents trans-conductance of the NMOS transistor, $C_{gs}$ represents parasitic capacitance of the NMOS transistor, and $\omega_0$ represents a resonant frequency.

As expressed in Equation 2, the feedback amplifier 101 in accordance with the embodiment of the present invention has a quality factor obtained by adding $(\omega_0 L_g)^2/R_m$ to a quality factor of a general cascode amplifier. The quality factor of the feedback amplifier 101 becomes smaller than that of the general amplifier. Since the quality factor is in inverse proportion to a bandwidth, the feedback amplifier 101 exhibits a wideband characteristic as expressed in Equation 2.

Returning to FIG. 2, the inductor 17 operating as a load resonates with a large value at a low frequency, and the signals transferred to the inductor are transferred to the gate of the common-source NMOS transistor 24 through the AC coupling capacitor 23.

The cascode amplifier 102 includes the common-source NMOS transistor 24 and a common-gate NMOS transistor 25 which are connected in series to configure a cascode amplifier stage. The common-gate NMOS transistor 25 has a drain connected to an inductor 26 serving as a load which resonates a high-frequency band signal of the output signals, and a switch SW3 configured to switch the cascode amplifier stage in accordance with a control signal is connected in parallel to the source of the common-gate NMOS transistor 25 and the inductor 26. The switch SW3 is configured as an NMOS transistor 27 to switch the cascode amplifier stage in accordance with a control signal.

The signals transferred to the common-source NMOS transistor 24 are transferred to the inductor 26 operating as a load through the common-gate NMOS transistor 25. The inductor 26 having a smaller value than the inductor 17 of the feedback amplifier 101 is configured to resonate at a high frequency. The signals transferred to the inductor 26 are outputted to an output terminal $RF_{out}$ through an AC coupling capacitor 33 through a source follower 103 serving as an output buffer for reducing signal attenuation during measurement. The source follower 103 includes an NMOS transistor 30, a resistor 31, and a current source 32. The source follower 103 serves as an output buffer configured to output the signals inputted from the cascode amplifier 102 to the output terminal without attenuation.

Table 1 shows examples of the voltage condition of the control signal in which the controlled-gain wideband feedback LNA in accordance with the embodiment of the present invention performs a controlled-gain function. As shown in Table 1, the switches SW1 to SW3 operate in accordance with the respective control voltages depending on the controlled-gain modes including the high-gain mode, the mid-gain mode, and the low-gain mode, and switch the corresponding units so as to control the power gain and NF of the entire LNA.

TABLE 1

| Mode | SW1 | SW2 | SW3 | Power gain | NF |
| --- | --- | --- | --- | --- | --- |
| High-gain | 0 V | 0 V | 0 V | 31.5 dB | 2.4 dB |
| Mid-gain | 0 V | 1.8 V | 1.8 V | 21.5 dB | 4.9 dB |
| Low-gain | 1.8 V | 1.8 V | 1.8 V | 12.3 dB | 7.3 dB |

Table 1 shows the power gain and NF characteristics which are exhibited in the respective gain modes by the switching operations depending on the voltages applied to the respective switches as the control signals. FIGS. 4 to 9 show the results obtained by simulating the power gain and NF characteristics using S-parameter response.

Figure 4:
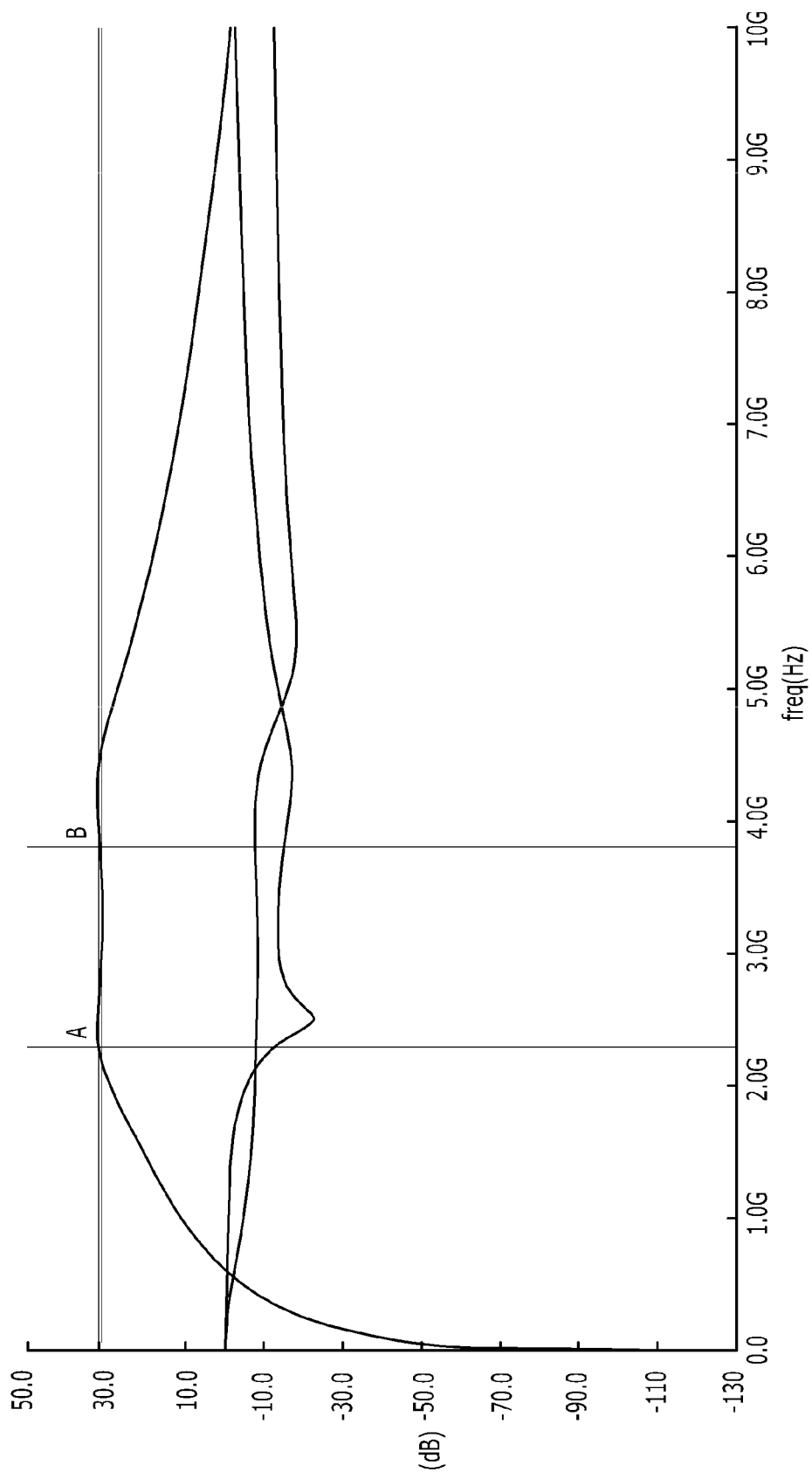
FIG. 4 is a diagram showing power gain characteristics of the controlled-gain wideband feedback LNA in accordance with the embodiment of the present invention, which operates in a high-gain mode.
Figure 5:
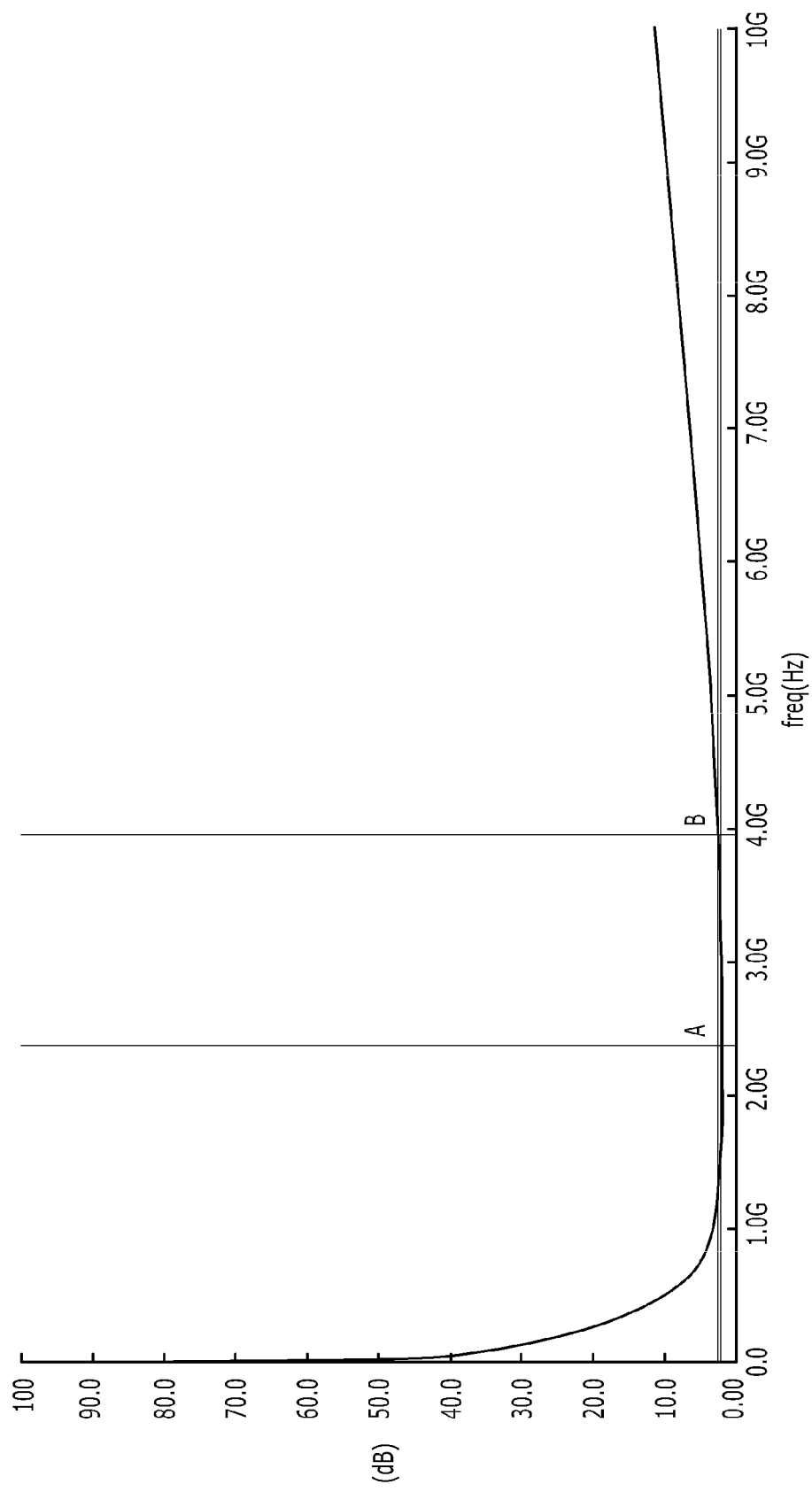
FIG. 5 is a diagram showing NF characteristics of the controlled-gain wideband feedback LNA in accordance with the embodiment of the present invention, which operates in the high-gain mode.
Figure 6:
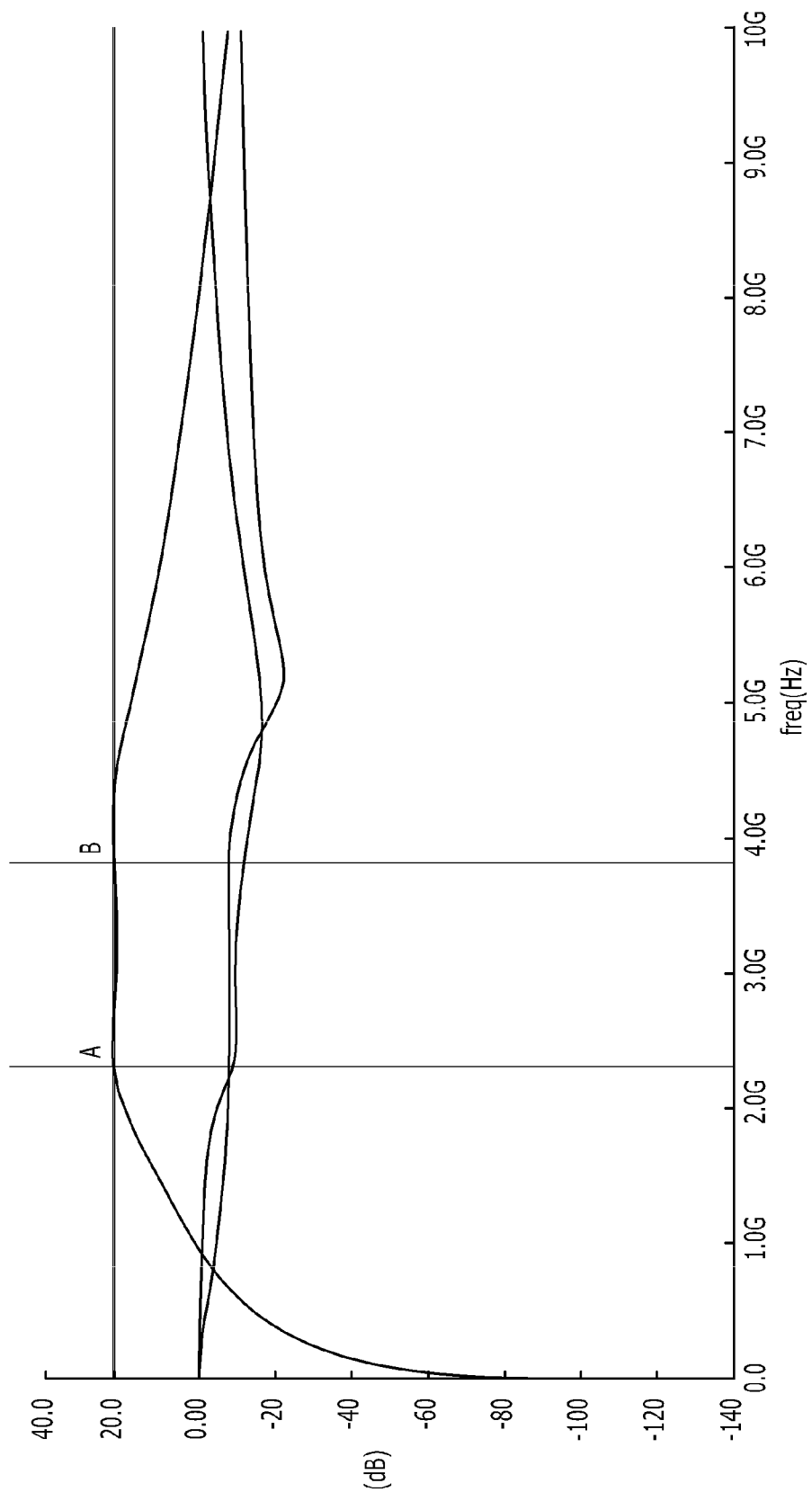
FIG. 6 is a diagram showing power gain characteristics of the controlled-gain wideband feedback LNA in accordance with the embodiment of the present invention, which operates in a mid-gain mode.
Figure 7:
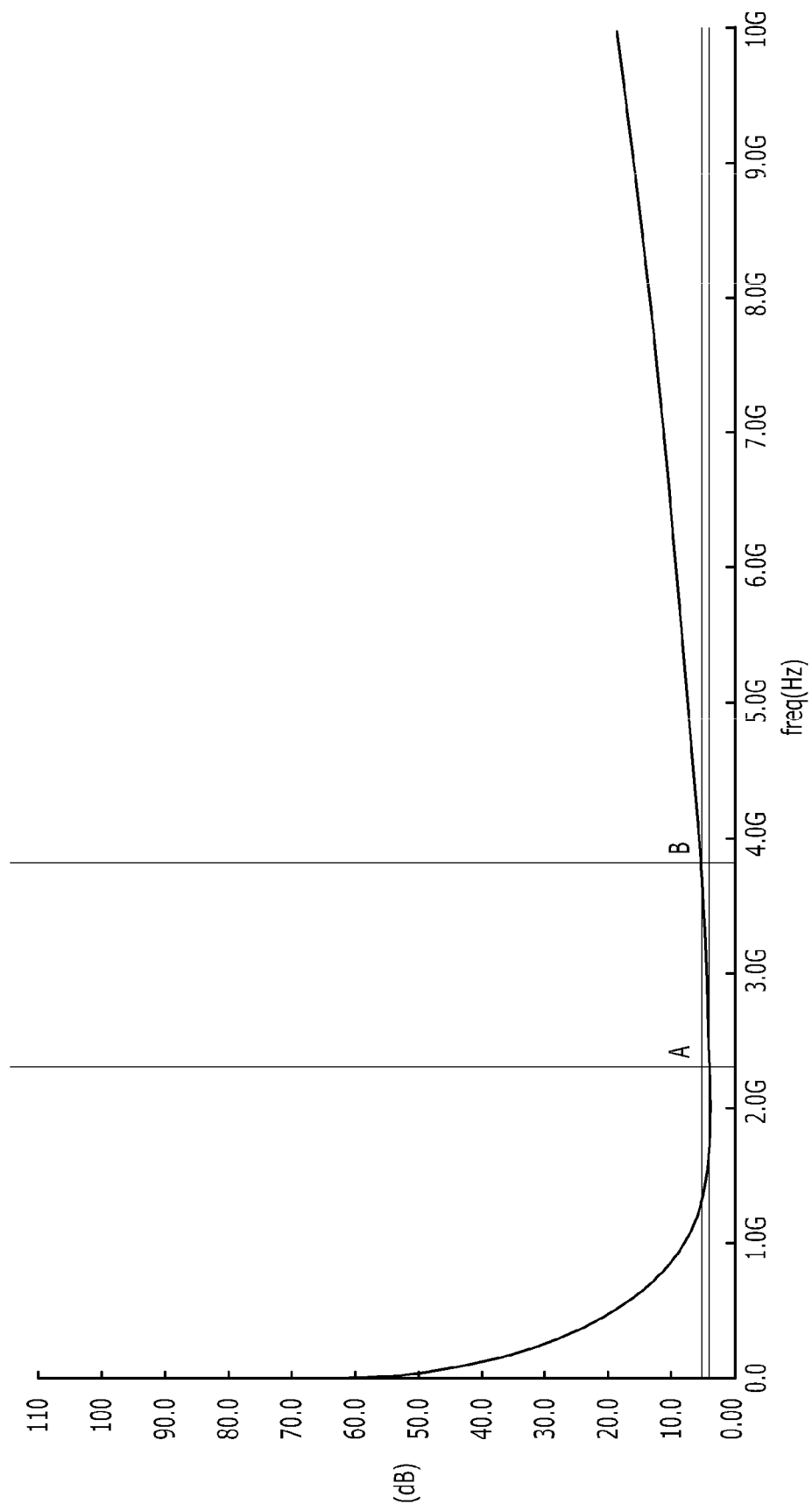
FIG. 7 is a diagram showing NF characteristics of the controlled-gain wideband feedback LNA in accordance with the embodiment of the present invention, which operates in the mid-gain mode.
Figure 8:
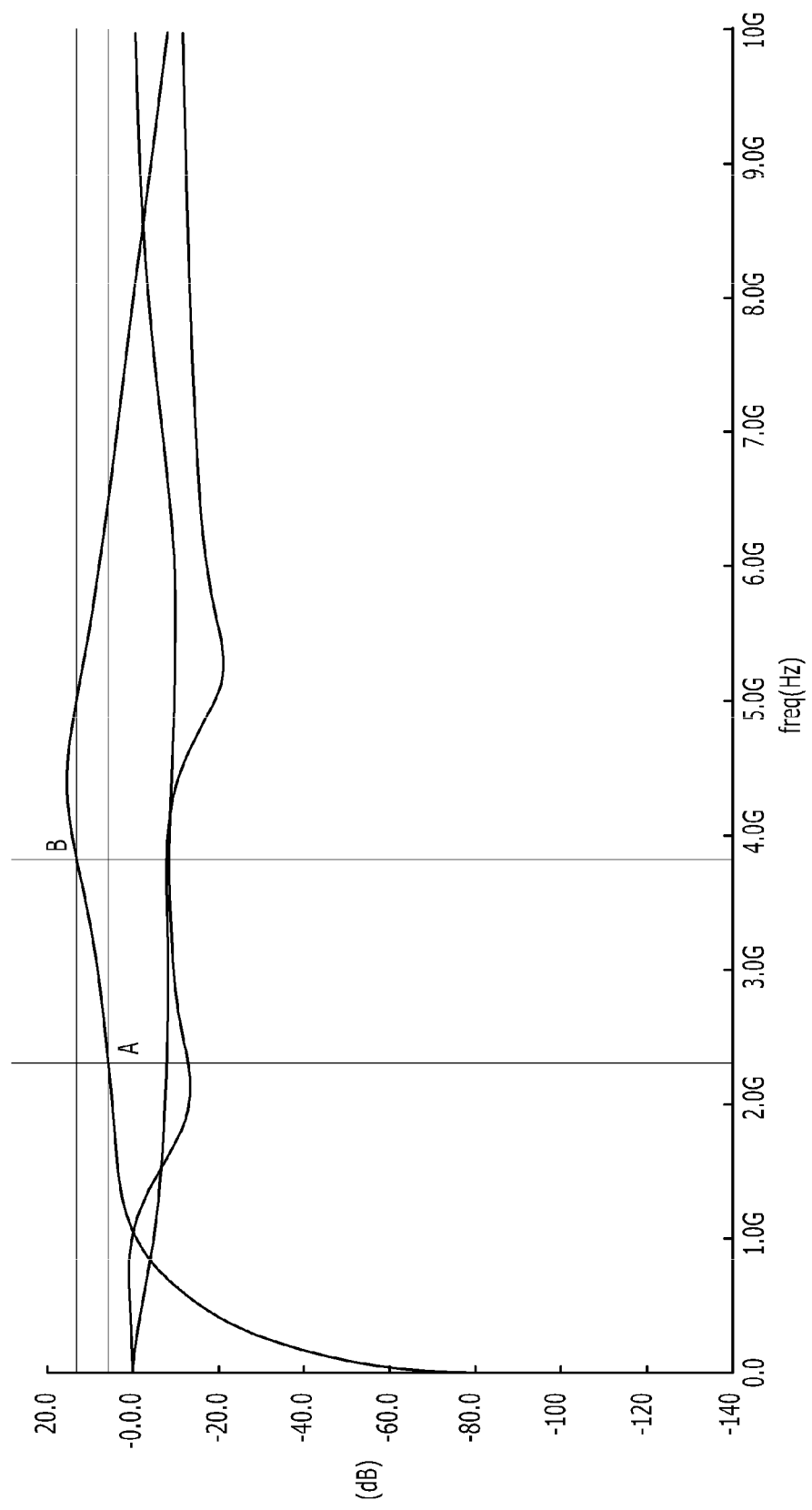
FIG. 8 is a diagram showing power gain characteristics of the controlled-gain wideband feedback LNA in accordance with the embodiment of the present invention, which operates in a low-gain mode.
Figure 9:
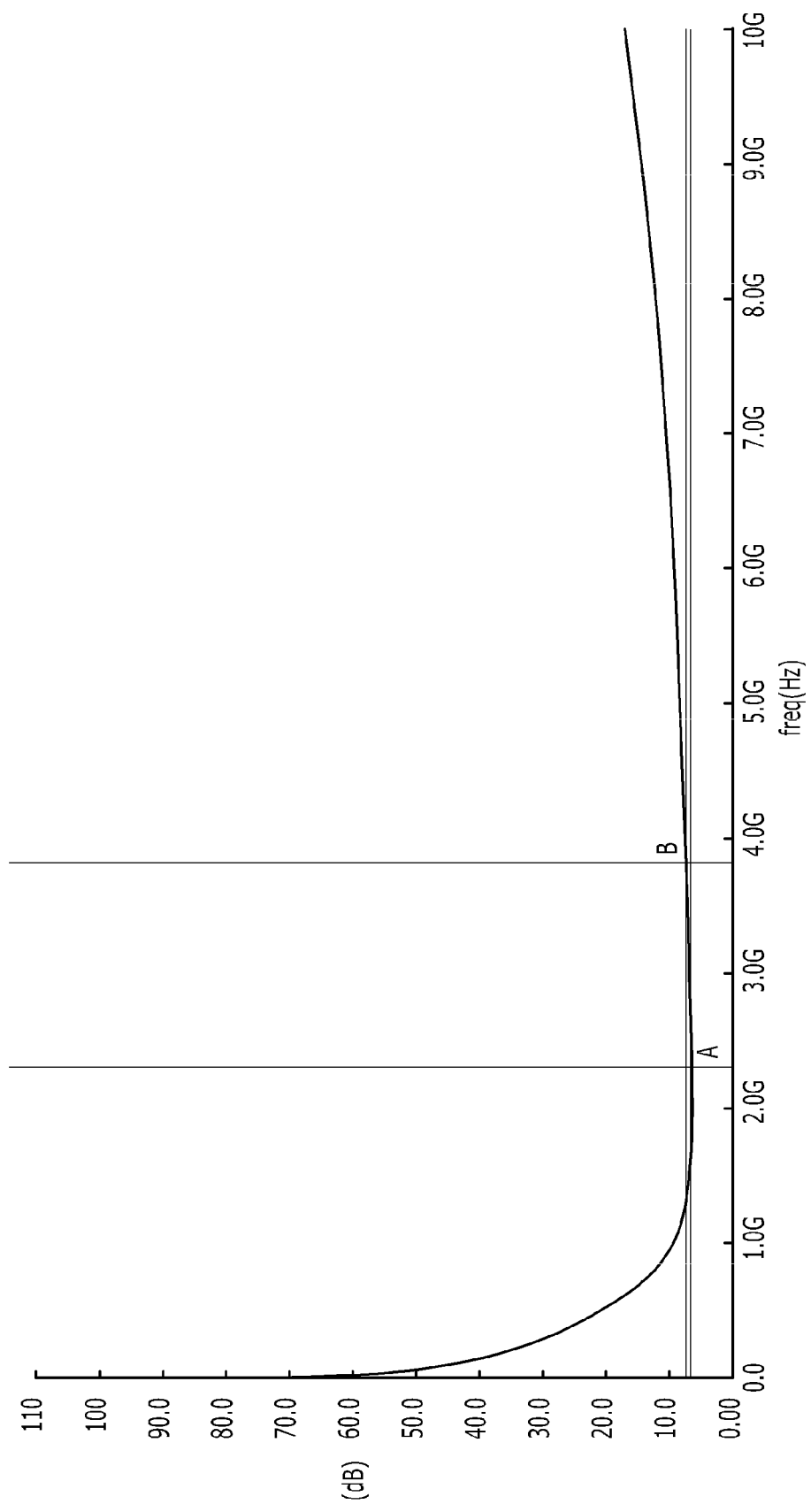
FIG. 9 is a diagram showing NF characteristics of the controlled-gain wideband feedback LNA in accordance with the embodiment of the present invention, which operates in the low-gain mode.

FIGS. 4 and 5 are diagrams showing the power gain and NF characteristics of the controlled-gain wideband feedback LNA in accordance with the embodiment of the present invention, which operates in the high-gain mode. FIGS. 6 and 7 are diagrams showing the power gain and NF characteristics of the controlled-gain wideband feedback LNA in accordance with the embodiment of the present invention, which operates in the mid-gain mode. FIGS. 8 and 9 are diagrams showing the power gain and NF characteristics of the controlled-gain wideband feedback LNA in accordance with the embodiment of the present invention, which operates in the low-gain mode. In FIGS. 4, 6, and 8, a horizontal axis indicates a frequency band, and a vertical axis indicates a power gain. In FIGS. 5, 7, and 9, a horizontal axis indicates a frequency band, and a vertical axis indicates an NF. Through FIGS. 4 to 9, it can be seen that desired power gain and NF are maintained at a certain frequency band A-B.

In the above-described controlled-gain wideband feedback LNA in accordance with the embodiment of the present invention, the input matching is implemented at a wideband in the feedback amplifier using the cascode-feedback structure such that the load may resonate at a low frequency. Furthermore, the cascode amplifier using the cascode structure increases the gain of the entire LNA such that the load may resonate at a high frequency. Furthermore, the gain of the entire circuit is controlled by operating the first to third switches SW1 to SW3 in accordance with the respective control signals.

In accordance with the embodiment of the present invention, it is possible to provide a controlled-gain wideband feedback LNA which may be used in a receiver stage of a fourth-generation mobile communication terminal system. Furthermore, the input matching may be implemented at a wideband, and the entire low-noise amplification gain may be increased. Furthermore, when the controlled-gain wideband feedback LNA is operated in the high-gain mode, the mid-gain mode, or the low-gain mode, a controlled gain may be controlled by controlling the switches in accordance with the control voltages.

While the present invention has been described with respect to the specific embodiments, it will be apparent to those skilled in the art that various changes and modifications may be made without departing from the spirit and scope of the invention as defined in the following claims.

What is claimed is:

1. A controlled-gain wideband feedback low-noise amplifier comprising:
    a feedback amplifier configured to isolate an input signal and an output signal obtained by amplifying the input signal, feed back the output signal to the input signal to amplify wideband input signals, resonate a low-frequency band signal among the wideband input signals to amplify the low-frequency band signal among the wideband input signals, and be switched in accordance with a control signal to control an amplification gain of the low-frequency band signal among the wideband input signals; and
    a cascode amplifier configured to amplify a high-frequency band signal among the wideband signals inputted from the feedback amplifier, and be switched in accordance with a control signal to control an amplification gain of the high-frequency band signal among the wideband signals.

2. The controlled-gain wideband feedback low-noise amplifier of claim 1, further comprising:
    an output buffer configured to output the signals inputted from the cascode amplifier to an output terminal without attenuation.

3. The controlled-gain wideband feedback low-noise amplifier of claim 2, wherein the output buffer is implemented as a source follower.

4. The controlled-gain wideband feedback low-noise amplifier of claim 3, wherein the feedback amplifier, the cascode amplifier, and the source follower comprise AC coupling capacitors provided at input and output terminals thereof.

5. The controlled-gain wideband feedback low-noise amplifier of claim 1, wherein the control signals comprise a first voltage and a second voltage higher than the first voltage;
    the first voltage is applied to the first to third switches such that the controlled-gain wideband feedback LNA has a high-gain characteristic;
    the second voltage is applied to the first to third switches such that the controlled-gain wideband feedback LNA has a low-gain characteristic; and
    the first voltage and the second voltage are applied to the first switch and the second and third switches, respectively, such that the controlled-gain wideband feedback LNA has a mid-gain characteristic.

6. A controlled-gain wideband feedback low-noise amplifier comprising:
    a feedback amplifier comprising:
        a first cascode amplifier stage comprising a first common-source NMOS transistor and a first common-gate NMOS transistor which are connected in series to each other;
        a feedback circuit configured to feed back output signals of the first common-gate NMOS transistor to the first common-source NMOS transistor;
        a first load stage configured to resonate a low-frequency band signal of the output signals; and
        first and second switches configured to switch the feedback circuit and the cascode amplifier stage, respectively, in accordance with control signals,
        wherein the feedback amplifier amplifies a low-frequency band signal among wideband signals which are inputted in accordance with the operations of the first and second switches; and
    a cascode amplifier comprising:
        a second cascode amplifier stage comprising a second common-source NMOS transistor and a second common-gate NMOS transistor which are connected in series to each other;
        a second load stage configured to resonate a high-frequency band signal of output signals of the second common-gate NMOS transistor; and
        a third switch configured to switch the second cascode amplifier stage in accordance with a control signal,
        wherein the cascode amplifier amplifies a high-frequency band signal among wideband signals which are inputted from the feedback amplifier in accordance with the operation of the third switch, and
    the gain of the entire circuit is controlled by operating the first to third switches in accordance with the control signals.

7. The controlled-gain wideband feedback low-noise amplifier of claim 6, further comprising:
    an output buffer configured to output the signals inputted from the cascode amplifier to an output terminal without attenuation.

8. The controlled-gain wideband feedback low-noise amplifier of claim 7, wherein the output buffer is implemented as a source follower.

9. The controlled-gain wideband feedback low-noise amplifier of claim 8, wherein the feedback amplifier, the cascode amplifier, and the source follower comprise AC coupling capacitors provided at input and output terminals thereof.

10. The controlled-gain wideband feedback low-noise amplifier of claim 6, wherein the control signals comprise a first voltage and a second voltage higher than the first voltage;
    the first voltage is applied to the first to third switches such that the controlled-gain wideband feedback LNA has a high-gain characteristic;

the second voltage is applied to the first to third switches such that the controlled-gain wideband feedback LNA has a low-gain characteristic; and the first voltage and the second voltage are applied to the first switch and the second and third switches, respectively, such that the controlled-gain wideband feedback LNA has a mid-gain characteristic.

11. The controlled-gain wideband feedback low-noise amplifier of claim 6, wherein the feedback circuit of the feedback amplifier comprises a capacitor connected to the drain of the first common-gate NMOS transistor and a feedback resistor connected to the gate of the first common-source NMOS transistor, and the capacitor and the feedback resistor are connected in series to each other.

12. The controlled-gain wideband feedback low-noise amplifier of claim 11, wherein the first switch is an NMOS switch connected in parallel to the feedback resistor.

13. The controlled-gain wideband feedback low-noise amplifier of claim 6, wherein the second switch is an NMOS switch connected in parallel to the source of the first common-gate NMOS transistor and the first load stage.

14. The controlled-gain wideband feedback low-noise amplifier of claim 6, wherein the third switch is an NMOS switch connected in parallel the source of the second common-gate NMOS transistor and the second load stage.

15. The controlled-gain wideband feedback low-noise amplifier of claim 6, wherein the first load stage of the feedback amplifier is an inductor which is connected to the drain of the first common-gate NMOS transistor and resonates a low-frequency band signal of the output signals to apply the low-frequency band signal to the cascode amplifier.

16. The controlled-gain wideband feedback low-noise amplifier of claim 6, wherein the second load stage of the cascode amplifier is an inductor which is connected to the drain of the second common-gate NMOS transistor and resonates a high-frequency band signal of the output signals to apply the high-frequency band signal to the source follower.

17. The controlled-gain wideband feedback low-noise amplifier of claim 6, wherein the feedback amplifier further comprises an inductor for input matching, which is provided at the gate and source of the first common-source NMOS transistor, respectively.

18. The controlled-gain wideband feedback low-noise amplifier of claim 6, wherein the feedback amplifier further comprises a high-capacity capacitor which is provided between the gate and source of the first common-source NMOS transistor so as to input an input signal to the gate of the first common-source NMOS transistor without reflection.

* * * * *